US012683510B2

(12) United States Patent (10) Patent No.: US 12,683,510 B2
Nakamura (45) Date of Patent: Jul. 14, 2026

(54) POWER CONVERSION DEVICE HAVING A CONTROL BOARD RETAINING MEMBER

(71) Applicant: Mitsubishi Electric Corporation, Tokyo (JP)

(72) Inventor: Takuya Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 330 days.

(21) Appl. No.: 18/492,265

(22) Filed: Oct. 23, 2023

(65) Prior Publication Data

US 2024/0413762 A1 Dec. 12, 2024

(30) Foreign Application Priority Data

Jun. 8, 2023 (JP) ................................. 2023-094489

(51) Int. Cl.
| | |
|---|---|
| *H02M 7/00* | (2006.01) |
| *H05K 1/181* | (2026.01) |
| *H05K 7/20* | (2006.01) |

(52) U.S. Cl.
CPC ............ *H02M 7/003* (2013.01); *H05K 1/181* (2013.01); *H05K 7/20927* (2013.01); *H05K 2201/10015* (2013.01); *H05K 2201/10272* (2013.01)

(58) Field of Classification Search
CPC ... H02M 7/003; H05K 1/181; H05K 7/20927; H05K 2201/10015; H05K 2201/10272; H05K 7/14329
See application file for complete search history.

(56) References Cited

U.S. PATENT DOCUMENTS

| | | | | |
|---|---|---|---|---|
| 5,841,189 | A * | 11/1998 | Shitama | ................ H01L 25/072 |
| | | | | 257/734 |
| 11,744,052 | B2 * | 8/2023 | Müller | ............... H05K 7/20872 |
| | | | | 361/699 |
| 11,929,687 | B2 * | 3/2024 | Nishizawa | .............. H02M 1/08 |
| | | (Continued) | | |

FOREIGN PATENT DOCUMENTS

| | | | | |
|---|---|---|---|---|
| JP | 2009130177 | A | * | 6/2009 |
| JP | 2012-217315 | A | | 11/2012 |
| | (Continued) | | | |

OTHER PUBLICATIONS

Office Action issued Nov. 4, 2025 in Japanese Application No. 2023-094489.

*Primary Examiner* — James Wu

(74) *Attorney, Agent, or Firm* — Sughrue Mion, PLLC

(57) ABSTRACT

This power conversion device includes: a plurality of power modules; a board which is placed at the plurality of power modules with a space provided between the board and the second surfaces, and is electrically connected to module terminals; and a board retention member which is placed in the space between the board and the plurality of power modules and retains the board, the board retention member being made of a resin member. The plurality of power modules are arranged side by side in a direction parallel to third surfaces. Each module terminal protrudes from at least one of the second surface of the power module, the third surface of the power module, and a fourth surface opposite to the third surface, and then extends toward the board. A part of the module terminal extending toward the board penetrates a through hole that the board retention member has.

11 Claims, 8 Drawing Sheets

(56) References Cited

U.S. PATENT DOCUMENTS

2012/0250380 A1    10/2012  Ichijyo et al.
2023/0156980 A1 *   5/2023  Kitagawa .............. H02M 7/003
361/699

FOREIGN PATENT DOCUMENTS

JP         2017-60291  A    3/2017
JP         6369355  B2   8/2018

* cited by examiner

POWER CONVERSION DEVICE HAVING A CONTROL BOARD RETAINING MEMBER

BACKGROUND

The present disclosure relates to a power conversion device.

Electrified vehicles such as hybrid vehicles (HV), plug-in hybrid vehicles (PHV, PHEV), electric vehicles (EV), and fuel cell vehicles (FCV) are provided with a power conversion device which is a component for electrification. Examples of power conversion devices include an inverter for converting DC power from a battery to AC power for a motor and supplying the AC power to the motor for driving, and a converter for boosting voltage of a battery. In recent years, such power conversion devices have been required to be reduced in cost.

In addition, in the HV, the PHV, and the PHEV, a power conversion device as well as an engine is mounted inside an engine room. Therefore, a small-sized power conversion device is often required. Also, in the EV, a driving motor and an inverter may be mounted on the rear side, and for ensuring a trunk room and an occupant compartment space, a small-sized power conversion device is often required.

Further, in recent years, there have been increasing cases where, for shortening a connection harness of power conversion devices, the number of housings of the power conversion devices is decreased, and for achieving cost reduction and size reduction, power conversion devices such as an inverter are rigid-connected directly to a housing of a motor, an engine, a transmission, or the like. Therefore, the internal components of the power conversion device are required to meet strict vibration specifications. A general power conversion device structure that meets strict vibration specifications is disclosed (see, for example, Patent Document 1). In the structure disclosed in Patent Document 1, a board is directly fixed to a base member which is a heat dissipation member by a support member. Therefore, vibration resistance of the board and components mounted to the board is ensured.

Patent Document 1: Japanese Patent No. 6369355

Such a power conversion device for an electrified vehicle, e.g., an inverter, can have various layouts. One of the layouts is a layout in which power modules for U, V, W phases are arranged side by side on a cooler, a board is provided vertically upward of the power modules, and terminals for controlling the power modules extend from the power modules to the board. For minimizing the mounting area of the power modules on the cooler, a sufficient gap cannot be provided between two power modules adjacent to each other. Accordingly, a boss fixed portion for fixing the board as described in Patent Document 1 cannot be provided to the cooler, and thus there is a problem that it is difficult for the board and components mounted to the board to meet vibration specifications.

In Patent Document 1, since the board is fixed to the base member, the board and the components mounted to the board can meet strict vibration specifications. However, since the board is directly fixed to the base member, a space for fixing the board needs to be provided at a part of the base member opposed to the board, so that the size of the base member increases, thus having a problem that it is difficult to reduce the size and the cost of the power conversion device.

SUMMARY

Accordingly, an object of the present disclosure is to provide a power conversion device of which the size and the cost are reduced while vibration resistance is ensured.

A power conversion device according to the present disclosure includes: a plurality of power modules including semiconductor chips and arranged side by side, each power module being formed in a rectangular parallelepiped shape having a first surface, a second surface opposite to the first surface, and a third surface, a fourth surface, a fifth surface, and a sixth surface which are four surfaces surrounding the first surface and the second surface; a board which is placed at the second surfaces of the plurality of power modules with a space provided between the board and the second surfaces, and is electrically connected to module terminals that the plurality of power modules respectively have; and a board retention member which is placed in the space between the board and the plurality of power modules and retains the board, the board retention member being made of a resin member having insulation property. The plurality of power modules are arranged side by side in a direction parallel to the third surfaces. Each module terminal protrudes from at least one of the second surface of the power module, the third surface of the power module, and the fourth surface opposite to the third surface, and then extends toward the board. A part of the module terminal extending toward the board penetrates a through hole that the board retention member has.

The power conversion device according to the present disclosure includes: the plurality of power modules including semiconductor chips and arranged side by side, each power module being formed in the rectangular parallelepiped shape having the first surface, the second surface opposite to the first surface, and the four surfaces surrounding the first surface and the second surface; the board which is placed at the second surfaces of the plurality of power modules with the space provided between the board and the second surfaces, and is electrically connected to the module terminals that the plurality of power modules respectively have; and the board retention member which is placed in the space between the board and the plurality of power modules and retains the board, the board retention member being made of the resin member having insulation property. The plurality of power modules are arranged side by side in the direction parallel to the third surfaces. Each module terminal protrudes from at least one of the second surface of the power module, the third surface of the power module, and the fourth surface opposite to the third surface, and then extends toward the board. The part of the module terminal extending toward the board penetrates the through hole that the board retention member has. Thus, the board is retained by the board retention member placed in the space between the board and the plurality of power modules, whereby vibration resistance of the board and components mounted to the board can be ensured. Since the board need not be retained by providing a gap between the power modules arranged side by side, the size and the cost of the power conversion device can be reduced. Since the module terminal is connected to the board by penetrating the through hole that the board retention member has, the module terminal can be shortened, whereby the size and the cost of the power conversion device can be reduced.

DETAILED DESCRIPTION OF THE EMBODIMENTS

Figure 1:
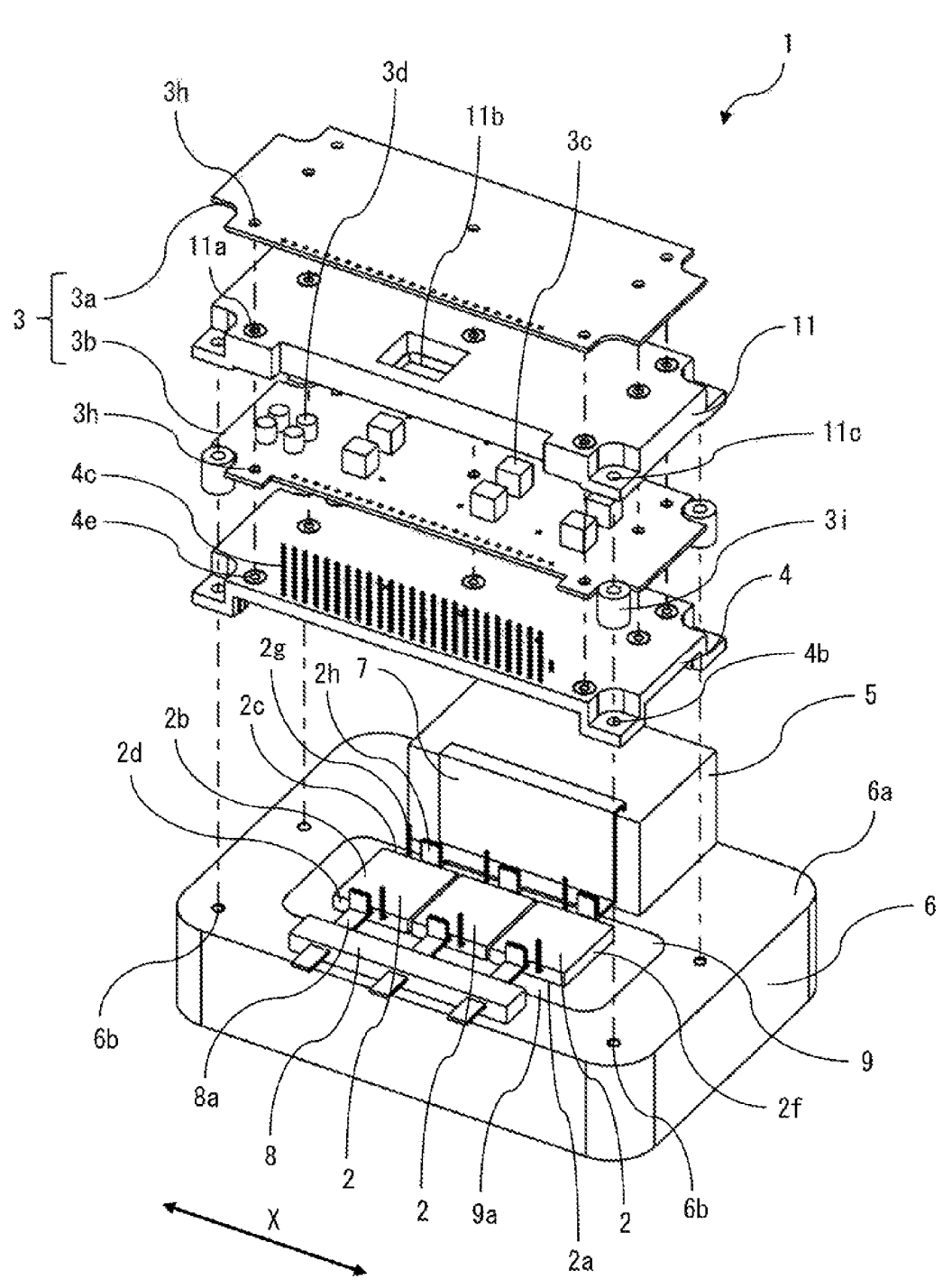
FIG. 1 is an exploded perspective view schematically showing a power conversion device according to the first embodiment of the present disclosure.

Hereinafter, a power conversion device according to embodiments of the present disclosure will be described with reference to the drawings. In the drawings, the same or corresponding members and parts are denoted by the same reference characters, to give description.

First Embodiment

Figure 2:
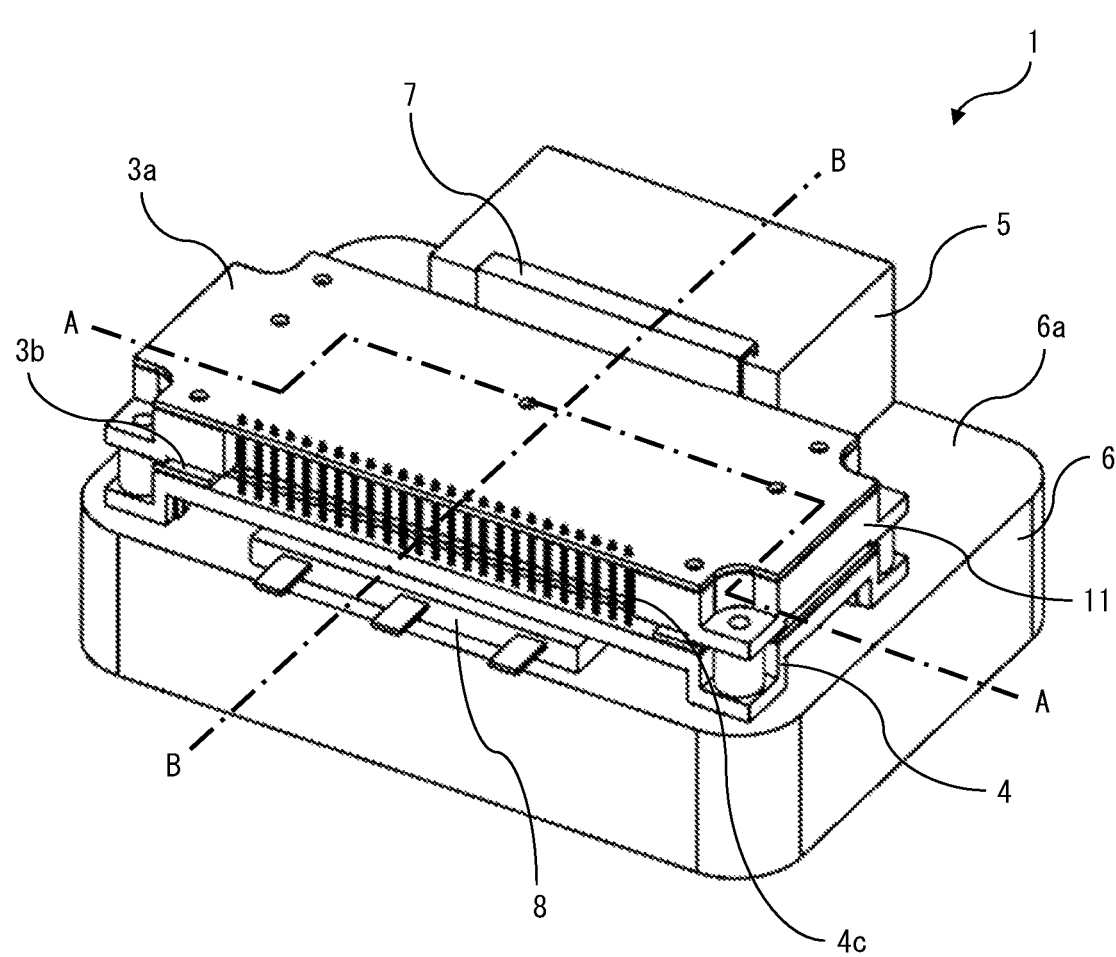
FIG. 2 is a perspective view schematically showing the power conversion device according to the first embodiment.
Figure 3:
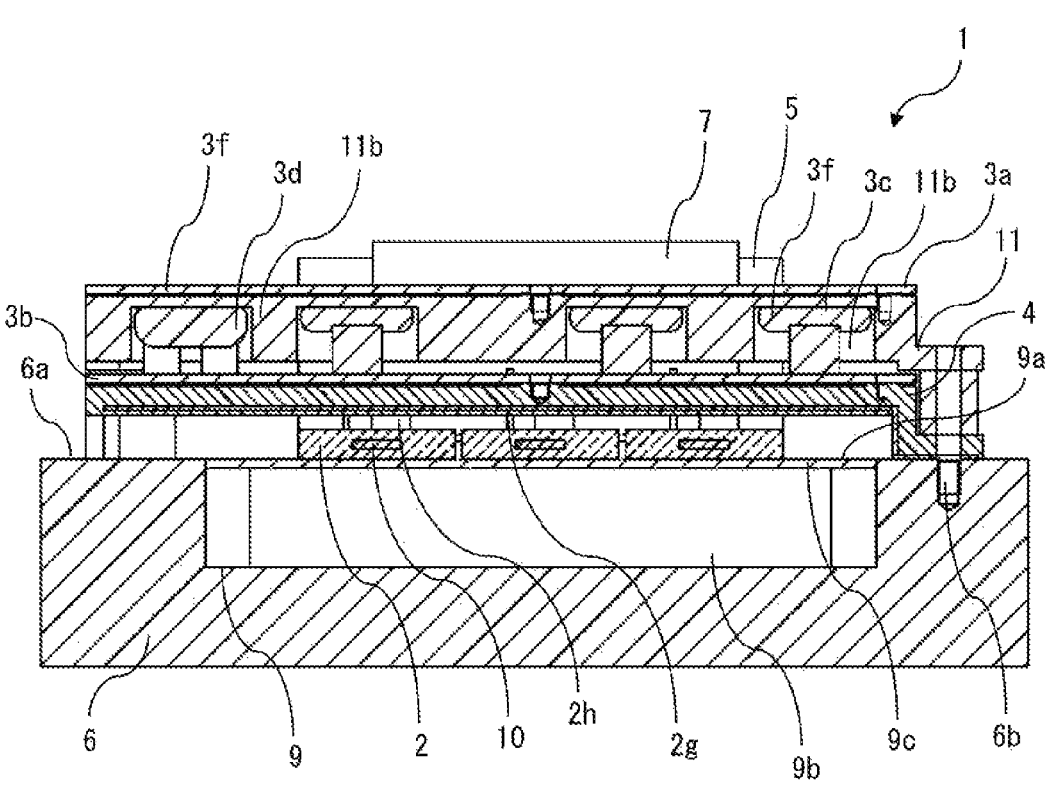
FIG. 3 is a sectional view of the power conversion device taken at an A-A cross-section position in FIG. 2.
Figure 4:
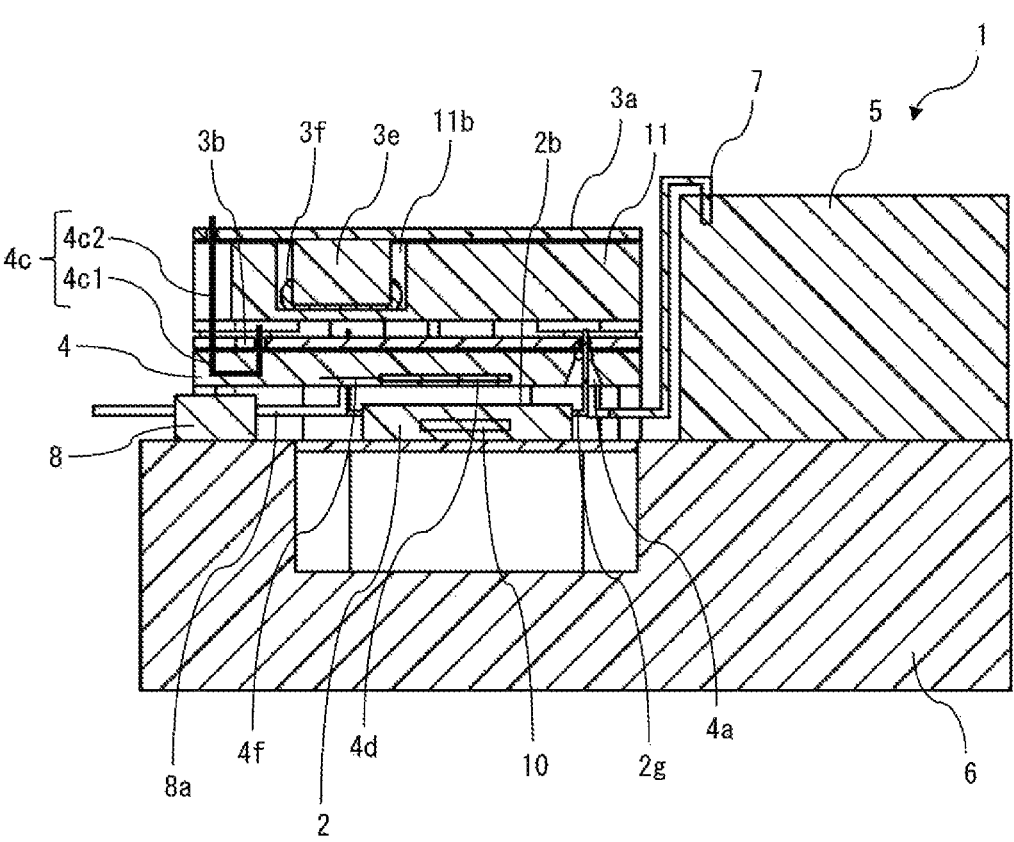
FIG. 4 is a sectional view of the power conversion device taken at a B-B cross-section position in FIG. 2.
Figure 5:
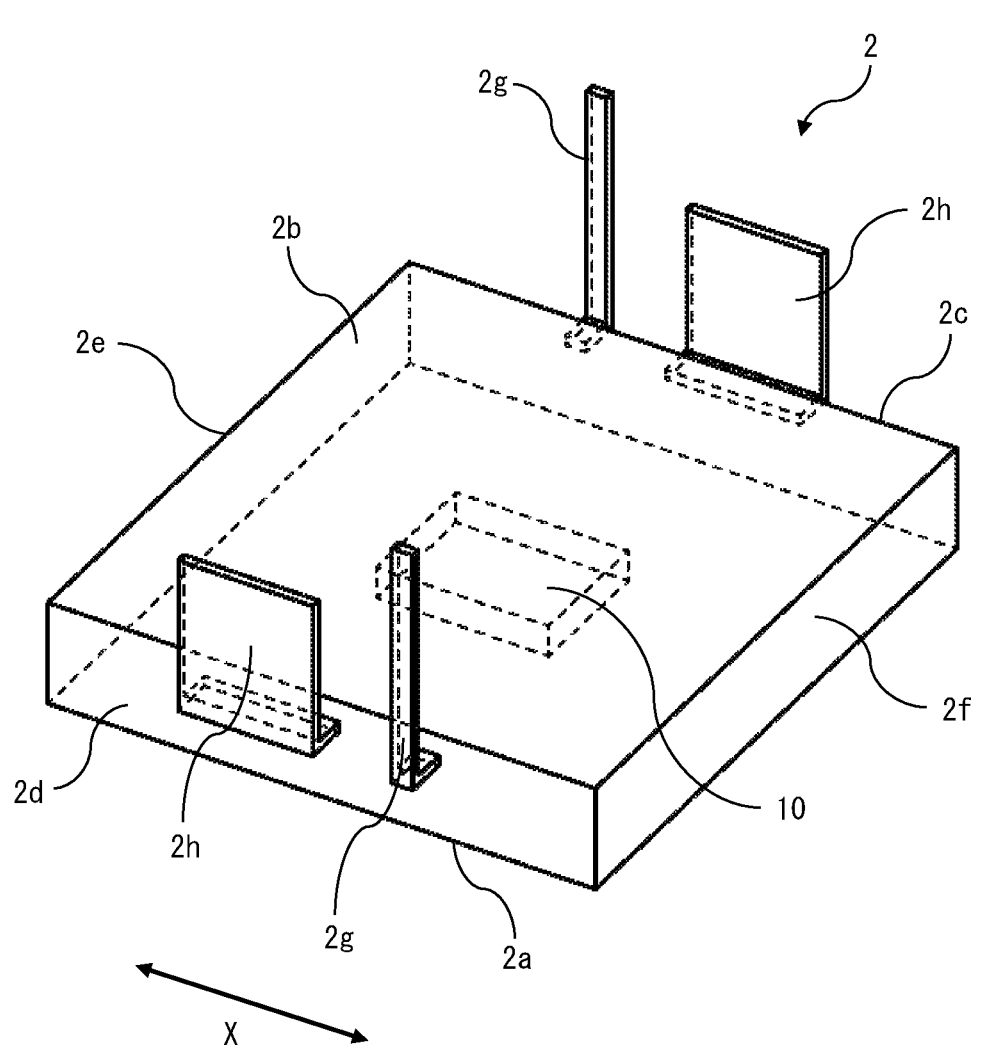
FIG. 5 is a perspective view showing a power module of the power conversion device according to the first embodiment.
Figure 6:
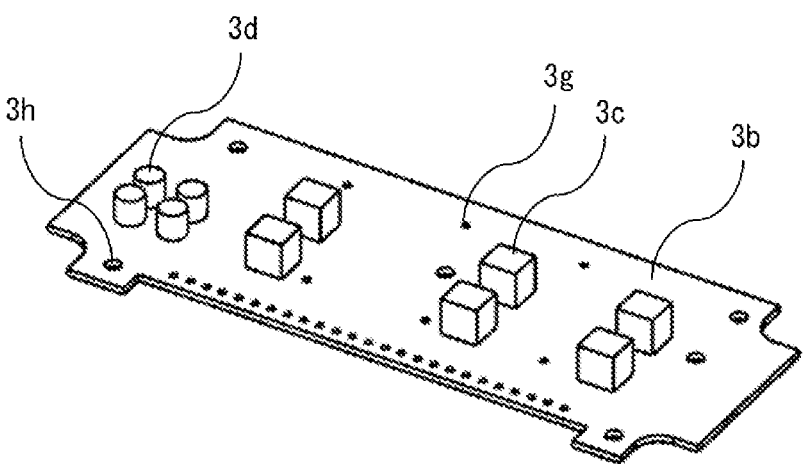
FIG. 6 is a perspective view showing a drive circuit board of the power conversion device according to the first embodiment.
Figure 7:
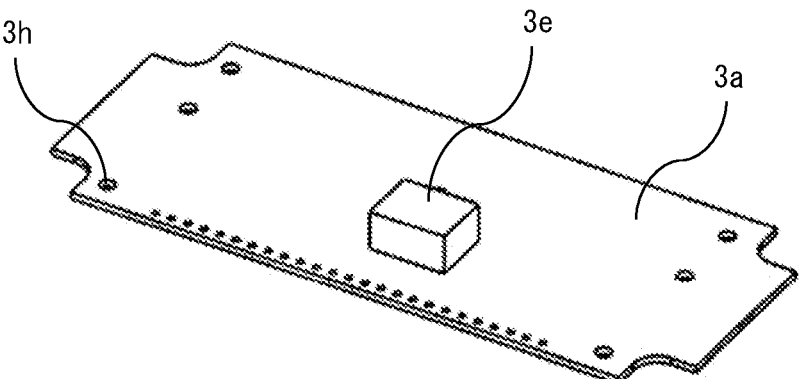
FIG. 7 is a perspective view showing a control circuit board of the power conversion device according to the first embodiment.
Figure 8:
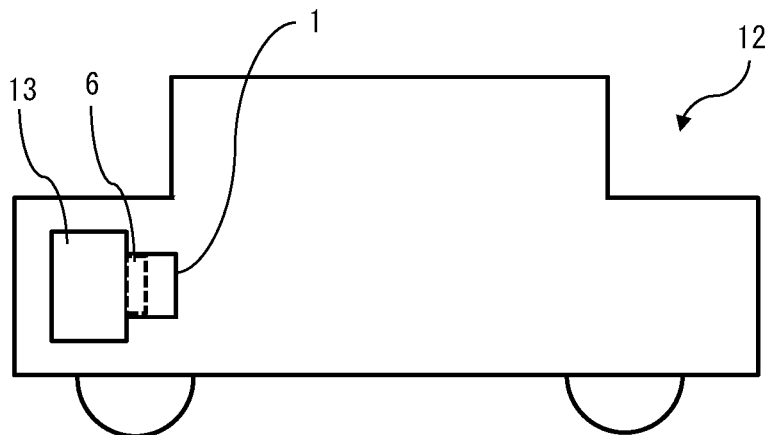
FIG. 8 shows an example of a state in which the power conversion device according to the first embodiment is installed.

FIG. 1 is an exploded perspective view schematically showing a power conversion device 1 according to the first embodiment of the present disclosure. FIG. 2 is a perspective view schematically showing the power conversion device 1. FIG. 3 is a sectional view of the power conversion device 1 taken at an A-A cross-section position in FIG. 2. FIG. 4 is a sectional view of the power conversion device 1 taken at a B-B cross-section position in FIG. 2. FIG. 5 is a perspective view showing a power module 2 of the power conversion device 1. FIG. 6 is a perspective view showing a drive circuit board 3b of the power conversion device 1. FIG. 7 is a perspective view showing a control circuit board 3a of the power conversion device 1. FIG. 8 shows an example of a state in which the power conversion device 1 is installed. The power conversion device 1 is a device for converting input current from DC to AC or from AC to DC, or converting input voltage to different voltage. In the present embodiment, a case where the power conversion device 1 is an inverter which converts DC power by the power module 2 and outputs three-phase AC power, will be described. The configuration of the power conversion device 1 is not limited thereto.

<Power Conversion Device 1>

As shown in FIG. 1, the power conversion device 1 includes a plurality of power modules 2, a board 3, and a board retention member 4. The power modules 2 include semiconductor chips 10 (not shown in FIG. 1) and are arranged side by side. As shown in FIG. 5, each power module 2 is formed in a rectangular parallelepiped shape having a first surface 2a, a second surface 2b opposite to the first surface 2a, and a third surface 2c, a fourth surface 2d, a fifth surface 2e, and a sixth surface 2f which are four surfaces surrounding the first surface 2a and the second surface 2b. As shown in FIG. 1, the board 3 is placed at the second surfaces 2b of the plurality of power modules 2 with a space provided between the board 3 and the second surfaces 2b, and is electrically connected to module terminals 2g that the plurality of power modules 2 respectively have. The board retention member 4 is placed in the space between the board 3 and the plurality of power modules 2, and retains the board 3. The board retention member 4 is made of a resin member having insulation property.

The number of boards 3 is not limited to one. In the present embodiment, the power conversion device 1 includes two boards 3. The two boards 3 are the control circuit board 3a and the drive circuit board 3b. The plurality of power modules 2 are arranged side by side in the direction parallel to the third surfaces 2c. In the drawings, the direction parallel to the third surfaces 2c is defined as an X direction. The module terminal 2g protrudes from at least one of the second surface 2b of the power module 2, the third surface 2c of the power module 2, and the fourth surface 2d opposite to the third surface 2c, and then extends toward the board 3. As shown in FIG. 4, a part of the module terminal 2g extending toward the board 3 penetrates a through hole 4a that the board retention member 4 has. In the present embodiment, one module terminal 2g is provided at each of the third surface 2c and the fourth surface 2d of the power module 2, and is connected to the drive circuit board 3b. The placement surfaces of the power module 2 where the module terminals 2g are placed, the number of the module terminals 2g, and the board 3 to which the module terminals 2g are connected, are not limited to the above examples. In the present embodiment, the boards 3 are retained by connection terminals 4c that the board retention member 4 has. The details of the connection terminals 4c retaining the boards 3 will be described later.

With this configuration, the boards 3 are retained by the board retention member 4 placed in the space between the boards 3 and the plurality of power modules 2, whereby vibration resistance of the boards 3 and components mounted to the boards 3 can be ensured. Since the boards 3 need not be retained by providing a gap between the power modules 2 arranged side by side, the size and the cost of the power conversion device 1 can be reduced. Since the module terminal 2g is connected to the board 3 by penetrating the through hole 4a that the board retention member 4 has, the module terminal 2g can be shortened, whereby the size and the cost of the power conversion device 1 can be reduced. In addition, since the module terminal 2g is shortened, the distance between the power module 2 and the drive circuit can be shortened, whereby controllability for the power module 2 can be improved.

The module terminal 2g is connected to the drive circuit board 3b at a through hole 3g provided in the drive circuit board 3b. In the present embodiment, the through holes 4a have funnel shapes of which openings on the side of the plurality of power modules 2 are larger than openings on the side of the drive circuit board 3b. With this configuration, an additional guide component for guiding the module terminal 2g to the through hole 3g, which would be needed for connecting the module terminal 2g and the through hole 3g, is not needed, so that the distance between the power module 2 and the drive circuit board 3b can be shortened. Since the distance between the power module 2 and the drive circuit board 3b is shortened, the distance between the power module 2 and the drive circuit can be shortened, whereby controllability for the power module 2 can be improved. In addition, since the height of the power conversion device 1 is reduced, the size of the power conversion device 1 can be reduced.

<Cooler 9, Housing 6, Film Capacitor 5>

As shown in FIG. 1, the power conversion device 1 further includes a cooler 9, a housing 6, and a film capacitor 5. The cooler 9 has a cooling surface 9a to which the first surfaces 2a of the plurality of power modules 2 are thermally connected. As shown in FIG. 3, the cooler 9 includes a flow path 9b through which a coolant flows. The cooling surface 9a is formed on a lid 9c covering the flow path 9b. As the coolant, for example, water or an ethylene glycol solution is used. As shown in FIG. 1, the housing 6 has the cooler 9 and has a placement surface 6a on the same side as the side where the cooling surface 9a is provided. In the present embodiment, the cooling surface 9a and the placement surface 6a are provided on the same plane. The housing 6 is manufactured by die casting from metal such as aluminum. The lid 9c is, for example, a forged aluminum alloy. The film capacitor 5 is electrically connected to the plurality of power modules 2 via a busbar 7. The film capacitor 5 is adjacent to the plurality of power modules 2 and is thermally connected to the placement surface 6a of the housing 6. The plurality of power modules 2 and the film capacitor 5 are cooled by the cooler 9. The busbar 7 is connected to power terminals 2h of the power modules 2 by welding, for example.

The placement surface 6a has a boss fixed portion 6b to which a fixation boss 4b that the board retention member 4 has is fixed. The boss fixed portion 6b is provided at a part of the placement surface 6a other than the cooling surface 9a and a projected part of the placement surface 6a where the film capacitor 5 and the busbar 7 are projected on the placement surface 6a. Means for fixing the fixation boss 4b and the boss fixed portion 6b is, for example, screwing. With this configuration, since the board retention member 4 retaining the boards 3 is fixed to the part of the placement surface 6a other than the cooling surface 9a and the projected part of the placement surface 6a where the film capacitor 5 and the busbar 7 are projected on the placement surface 6a, the boss fixed portions 6b need not be provided between the power modules 2 arranged side by side, at the cooling surface 9a where the flow path 9b is provided on the inner side, and between the power modules 2 and the film capacitor 5. Since the boss fixed portions 6b need not be provided between the power modules 2 arranged side by side, at the cooling surface 9a, and between the power modules 2 and the film capacitor 5, the size and the cost of the power conversion device 1 can be reduced. Since the boards 3 are retained by the board retention member 4, vibration resistance of the boards 3 and components mounted to the boards 3 can be ensured.

In addition, as seen in the direction perpendicular to the second surfaces 2b of the plurality of power modules 2, the boards 3 are placed at a position not overlapping the film capacitor 5 which is a component having a great height. Thus, a wasteful space is eliminated and the height of the power conversion device 1 can be reduced. The fixation location of the board retention member 4 is not limited to the placement surface 6a of the housing 6. For example, in a case where the power module 2 is configured such that the semiconductor chip 10 is stored in a casing and the inside of the casing is filled with a gel, a boss fixed portion may be provided on the board retention member 4 side inside the casing.

<Power Module 2>

The power module 2 will be described. In FIG. 5, one semiconductor chip 10 is shown by a broken line. The number of semiconductor chips 10 included in the power module 2 is not limited to one, and the power module 2 may include a plurality of semiconductor chips 10. The power module 2 converts DC power and outputs three-phase AC power. In the present embodiment, as shown in FIG. 1, the power conversion device 1 includes three power modules 2 corresponding to the respective phases. The number of power modules 2 included in the power conversion device 1 is not limited thereto. The number of power modules 2 may be two or may be four or more. The first surface 2a of each power module 2 is thermally connected to the cooling surface 9a via a joining member (not shown). The joining member is, for example, solder.

Arrangement of the plurality of power modules 2 is such that the power modules 2 are arranged with the same orientation side by side in the X direction which is the direction parallel to the third surfaces 2c. With this configuration, the plurality of power modules 2 are arranged so as to be aligned in the same direction, whereby the size of the power conversion device 1 can be reduced. In a case of providing more power modules 2, the power modules 2 may be arranged so as to be aligned in two rows.

The module terminals 2g and the power terminals 2h are made of copper having a small electrical resistivity and a high electric conductivity, for example. The module terminals 2g are terminals for driving of the power module 2. The power terminals 2h are terminals for input/output of the power module 2. For example, one power terminal 2h is connected to a DC power supply, and another power terminal 2h is connected to a motor which is a load. In the present embodiment, the one power terminal 2h is connected to the film capacitor 5 via the busbar 7 and then connected to a DC power supply (not shown) via the film capacitor 5. The film capacitor 5 smooths power to be inputted to the power module 2.

The power module 2 is formed by transfer molding. Therefore, the semiconductor chip 10 is covered by mold resin. With this configuration, the semiconductor chip 10 can be easily protected from the outside. In addition, it is difficult to retain the boards 3 at the power module 2 formed by transfer molding, but in the present disclosure, since the board retention member 4 for retaining the boards 3 is provided, vibration resistance of the boards 3 can be improved without retaining the boards 3 at the power module 2. The power module 2 is not limited to a configuration formed by transfer molding, and may be configured such that the semiconductor chip 10 is stored in a casing and the inside of the casing is filled with a gel. Even in a case where the semiconductor chip 10 is sealed by a gel, vibration resistance of the boards 3 can be improved.

<Board Retention Member 4>

A configuration for retaining the boards 3 at the board retention member 4 will be described with reference to FIG. 4. The board retention member 4 has the connection terminals 4c mechanically connected to the boards 3. Each connection terminal 4c has a buried portion 4c1 buried in the board retention member 4 and extending portions 4c2 extending toward the boards 3 and connected to the boards 3. The boards 3 are retained at the board retention member 4 by the connection terminals 4c. The connection terminals 4c are made of metal, for example. In the present embodiment, both of the control circuit board 3a and the drive circuit board 3b are connected to a plurality of connection terminals 4c and thus retained by the board retention member 4. In the present embodiment, each connection terminal 4c is formed in a U shape, the bottom of the U shape corresponds to the buried portion 4c1, and the extending portions 4c2 are formed at one end and another end of the connection terminal 4c. The control circuit board 3a is connected to one end of the connection terminal 4c at a part where the control circuit board 3a overlaps the board retention member 4 as seen in the direction perpendicular to the second surfaces 2b of the plurality of power modules 2. The drive circuit board 3b is connected to another end of the connection terminal 4c at a part where the drive circuit board 3b overlaps the board retention member 4 as seen in the direction perpendicular to the second surfaces 2b of the plurality of power modules 2. The boards 3 and the connection terminals 4c are connected by solder, for example. The connection terminals 4c are provided to the board retention member 4 when the board retention member 4 is formed by resin, for example.

With this configuration, the connection terminals 4c can be used as structural members for fixing the boards 3 to the board retention member 4, without using fastening members such as bolts. As compared to bolts, in a case of fixing the boards 3 by the connection terminals 4c, the boards 3 can be fixed with a smaller area, whereby the size of the power conversion device 1 can be reduced. In addition, as compared to bolts, in a case of fixing the boards 3 by the connection terminals 4c, the boards 3 can be fixed in a short time in manufacturing, so that the number of assembly steps in manufacturing and the investment amount for assembly equipment can be decreased and thus productivity of the power conversion device 1 can be improved.

Effects of the above-described configuration will be further described. In order to improve vibration resistance of the boards 3, it is desirable to ensure rigidity of the boards 3. In order to ensure rigidity with the board alone, a second moment of area represented by Expression (1) needs to be increased. Specifically, the second moment of area of the board 3 about the X direction which is the longitudinal direction of the board 3 needs to be increased. The calculation formula for a second moment of area I in a rectangular cross-section of the board 3 is represented by Expression (1).

$$I = b \times h^3/12 \tag{1}$$

In Expression (1), b is the width of the rectangle and h is the height thereof. In the structure having a rectangular cross-section, the second moment of area can be increased by increasing the width b and the height h. One conceivable method for increasing the second moment of area is to increase the thickness of the board 3. However, changing the thickness of the board 3 to a thickness generally unavailable leads to increase in the cost of the board 3.

In addition, in order to ensure rigidity of the board 3, deflection of the board 3 needs to be suppressed. The calculation formula for deflection δ at a center part of the board 3 is represented by Expression (2).

$$\delta = w \times l^4/(384 \times E \times I) \tag{2}$$

In Expression (2), w is the uniformly distributed load (the self-weight of the board 3), l is the beam length (the length of a longitudinal-direction part of the board 3), E is the Young's modulus, and I is the second moment of area.

The beam length l depends on the sizes of electric components mounted to the board 3 and the size of a circuit thereof, and therefore it is difficult to reduce the beam length l. It is difficult to increase the second moment of area I as described above. Thus, the beam length l and the second moment of area I in Expression (2) are constrained in the configuration of the present disclosure.

Other than the method of increasing the thickness of the board 3, it is conceivable that the board 3 is fixed to the board retention member 4 by bolts at multiple locations so that the board 3 and the board retention member 4 are made into one rigid member, thus increasing the second moment of area. However, increasing the number of fixation parts by bolts leads to size increase of the power conversion device 1, increase in assembly steps in manufacturing, and increase in the investment amount of assembly equipment.

In the configuration of the present disclosure, the connection terminals 4c are provided to the board retention member 4 molded with resin, and the boards 3 are fixed by the connection terminals 4c. Thus, deflection of the boards 3 can be suppressed by the connection terminals 4c which are structural members. In the present embodiment, the board retention member 4 has a plurality of connection terminals 4c, and the plurality of connection terminals 4c are arranged side by side in the longitudinal direction of the boards 3, whereby deflection of the boards 3 can be further suppressed. Since deflection of the boards 3 is suppressed, vibration resistance of the boards 3 and components mounted to the boards 3 can be improved.

In the present embodiment, the connection terminal 4c parts are electric circuit wires. The connection terminals 4c are made of copper having a high electric conductivity, for example. The connection terminals 4c and the boards 3 are connected by solder, for example, and the connection terminals 4c are used as wires of an electric circuit of the power conversion device 1. Since the connection terminals 4c can be used as wires of the electric circuit, wiring patterns on the boards 3 are reduced, whereby the size of the power conversion device 1 can be reduced.

In the present embodiment, the power conversion device 1 includes a plurality of boards 3, the connection terminals 4c are mechanically connected to the plurality of boards 3, and the connection terminal 4c parts are electric circuit wires. In a case where the power conversion device 1 is an inverter, the boards used for the inverter are roughly classified into two functions as a control circuit part and a drive circuit part. In a case where a board for the control circuit and a board for the drive circuit are prepared and the boards are connected by connectors and harnesses, cost for the connectors and the harnesses is added. In order to reduce the cost for the connectors and the harnesses, it is possible that the control circuit part and the drive circuit part are provided to one board instead of separating the board for the control circuit and the board for the drive circuit from each other. In a case of providing the control circuit part and the drive circuit part to one board, the size of the board is increased. Therefore, in order to prevent interference between the board and an electric component having a great height (e.g., the film capacitor 5), the board is placed above the component having a great height. In this case, a wasteful space is produced between the board and a component having a small height (e.g., the power module 2).

In the present embodiment, the power conversion device 1 includes the control circuit board 3a and the drive circuit board 3b as the plurality of boards 3. The number of the plurality of boards 3 is not limited to two. Both of the control circuit board 3a and the drive circuit board 3b are mechanically and electrically connected by the connection terminals 4c provided to the board retention member 4. Thus, without placing the boards above an electric component having a great height, both of the control circuit board 3a and the drive circuit board 3b can be placed in an area where electric components having small heights are present in the vicinity of the electric component having a great height. Since both of the control circuit board 3a and the drive circuit board 3b are placed in the vicinity of the electric component having a great height, a wasteful space in the vicinity of the electric component having a great height can be eliminated, whereby the size of the power conversion device 1 can be reduced. In addition, since board-connection connectors and harnesses for connecting both boards are not needed, the size and the cost of the power conversion device 1 can be reduced.

In the present embodiment, as seen in the direction perpendicular to the second surfaces 2b of the plurality of power modules 2, the plurality of boards 3 are arranged so as to overlap each other at least partially. As shown in FIG. 1, the power conversion device 1 includes the control circuit board 3a and the drive circuit board 3b as the plurality of boards 3. The control circuit board 3a and the drive circuit board 3b overlap each other except for a part of the control circuit board 3a connected to the connection terminals 4c. The area where the control circuit board 3a and the drive circuit board 3b overlap each other is not limited thereto.

With this configuration, as seen in the direction perpendicular to the second surfaces 2b of the plurality of power modules 2, the area occupied by the boards 3 in the power conversion device 1 can be reduced, whereby the size of the power conversion device 1 can be reduced. In the present disclosure, the example in which the power conversion device 1 includes a plurality of boards 3 has been shown. However, as long as size increase of the power conversion device 1 is suppressed, the number of boards 3 may be one. In addition, in the present disclosure, the example in which the power conversion device 1 includes a plurality of boards 3 and the plurality of boards 3 are placed so as to overlap each other, has been shown. However, as long as size increase of the power conversion device 1 is suppressed, the plurality of boards 3 may be arranged side by side without overlapping each other, as seen in the direction perpendicular to the second surfaces 2b of the plurality of power modules 2.

In the present embodiment, an additional board retention member 11 is provided at a part between the plurality of boards 3 overlapping each other, and the additional board retention member 11 retains at least one of the boards 3. In a case where the power conversion device 1 includes a plurality of boards 3, as shown in FIG. 1, the additional board retention member 11 may be provided between the control circuit board 3a and the drive circuit board 3b overlapping each other in the power conversion device 1. The additional board retention member 11 is made of a resin member having insulation property. The additional board retention member 11 has a board fixed portion 11a, and a fixation portion 3h of the control circuit board 3a is fixed to the board fixed portion 11a. In the present embodiment, the board retention member 4 has a board fixed portion 4e, and a fixation portion 3h of the drive circuit board 3b is fixed to the board fixed portion 4e. These portions may be fixed all together, and fixation means therefor is, for example, screwing.

With this configuration, the additional board retention member 11 having insulation property is provided between the control circuit board 3a and the drive circuit board 3b, whereby insulation property between the control circuit board 3a and the drive circuit board 3b can be improved. The control circuit board 3a is retained by the board fixed portion 11a of the additional board retention member 11 in addition to the connection terminals 4c, whereby vibration resistance of the control circuit board 3a and components mounted to the control circuit board 3a can be further improved. In the present embodiment, the additional board retention member 11 has a fixation boss 11c, and the fixation boss 11c is fixed to the boss fixed portion 6b together with the fixation boss 4b via a fixation assist portion 3i that the drive circuit board 3b has. Fixation means therefor is, for example, screwing.

In the present embodiment, the power conversion device 1 includes an AC terminal 8 having AC busbars 8a and electrically connected to the plurality of power modules 2 via the AC busbars 8a. The AC terminal 8 is placed at the placement surface 6a on a side of the plurality of power modules 2 opposite to the film capacitor 5 side. The AC busbars 8a are connected to the power terminals 2h of the power modules 2 by welding, for example. Ends of the AC busbars 8a on the side opposite to the power terminal 2h side are connected to a motor (not shown), for example. As shown in FIG. 4, the board retention member 4 is provided in at least a part between the drive circuit board 3b which is the board 3, and the busbar 7 and the AC busbars 8a. The busbar 7 and the AC busbars 8a are members to have high voltages.

With this configuration, the board retention member 4 having insulation property is provided between the drive circuit board 3b, and the busbar 7 part and the AC busbar 8a parts to have high voltages, whereby insulation between the drive circuit board 3b, and the busbar 7 part and the AC busbar 8a parts, can be ensured by the board retention member 4. Since insulation between the drive circuit board 3b, and the busbar 7 part and the AC busbar 8a parts, is ensured, the distances between the drive circuit board 3b, and the busbar 7 part and the AC busbar 8a parts, can be shortened. Since the distances between the drive circuit board 3b, and the busbar 7 part and the AC busbar 8a parts, can be shortened, the size of the power conversion device 1 can be reduced.

At least one of a transformer, an aluminum electrolytic capacitor, and a backup transformer which are mounted components and are electrically connected to the power modules 2, is provided to the board 3. In the present embodiment, as shown in FIG. 6, a transformer 3c and an aluminum electrolytic capacitor 3d are provided to the drive circuit board 3b. As shown in FIG. 7, a backup transformer 3e is provided to the control circuit board 3a. The transformer 3c and the aluminum electrolytic capacitor 3d are provided on a side of the drive circuit board 3b opposite to the power module 2 side, and the backup transformer 3e is provided on the power module 2 side of the control circuit board 3a.

The board retention member and a mounted component part opposed to the board retention member are adhered via an adhesive 3f. In the present embodiment, as shown in FIG. 3, the additional board retention member 11, and the transformer 3c part and the aluminum electrolytic capacitor 3d part opposed to the additional board retention member 11, are adhered via the adhesives 3f. As shown in FIG. 4, the additional board retention member 11 and the backup transformer 3e part opposed to the additional board retention member 11 are adhered via the adhesive 3f.

With this configuration, the transformer 3c, the aluminum electrolytic capacitor 3d, and the backup transformer 3e are fixed to the additional board retention member 11 which is the board retention member, whereby vibration resistance of the boards 3 and electric components mounted to the boards 3 can be further ensured. Since vibration resistance of the board 3 and electric components mounted to the board 3 is further ensured, the power conversion device 1 according to the present disclosure can be used as a power conversion device rigid-connected to an automobile motor, which is subject to strict requirements in vibration resistance. The rigid connection means that two members are mechanically connected not via a vibration absorbing material and do not deflect at a part where the two members are connected.

In the present embodiment, as shown in FIG. 3, recesses 11*b* are provided at parts of the additional board retention member 11 opposed to the transformer 3*c* and the aluminum electrolytic capacitor 3*d*, and the transformer 3*c* and the aluminum electrolytic capacitor 3*d* are adhered at the bottoms of the recesses 11*b* via the adhesives 3*f.* As shown in FIG. 4, a recess 11*b* is provided at a part of the additional board retention member 11 opposed to the backup transformer 3*e*, and the backup transformer 3*e* is adhered at the bottom of the recess 11*b* via the adhesive 3*f.* With this configuration, the distance between the control circuit board 3*a* and the drive circuit board 3*b* can be shortened, whereby the size of the power conversion device 1 can be reduced.

As shown in FIG. 4, the board retention member 4 has, therein, a plate 4*d* made of metal. The plate 4*d* is provided in the board retention member 4 when the board retention member 4 is molded with resin, for example. The fixation boss 4*b* of the board retention member 4 and the housing 6 are made of metal, and the plate 4*d*, the fixation boss 4*b*, and a ground of the drive circuit board 3*b* which is the board 3 are electrically connected. The potential of the housing 6 is a ground, and the plate 4*d*, the fixation boss 4*b*, and the ground of the drive circuit board 3*b* have the same potential as the potential of the housing 6. The plate 4*d*, the fixation boss 4*b*, and the ground of the board 3 are electrically connected using the connection terminal 4*c*, for example. For connection between the plate 4*d* and the fixation boss 4*b*, a connection wire 4*f* may be provided when the board retention member 4 is molded with resin, thereby connecting them.

With this configuration, it is possible to easily provide a necessary ground pattern for the transformer 3*c* connected to the drive circuit of the drive circuit board 3*b*. In addition, since the plate 4*d* is provided between the semiconductor chip 10 of the power module 2 and the drive circuit board 3*b* and is connected to the ground, the plate 4*d* can serve as a noise shield for blocking noise generated in switching of the semiconductor chip 10. Since the plate 4*d* serves as a noise shield, it is not necessary to newly add a noise shield and thus productivity of the power conversion device 1 can be improved. In addition, since the plate 4*d* has a higher Young's modulus than a resin material of the board retention member 4, rigidity of the board retention member 4 can be improved. In addition, since rigidity of the board retention member 4 is improved, vibration resistance of the boards 3 fixed to the board retention member 4 and electric components mounted to the boards 3 can be improved.

<Installation Example of Power Conversion Device 1>

The power conversion device 1 is a device mounted to a vehicle 12, for example. The vehicle 12 includes a vibration generation source 13 such as an engine, a transmission, a motor, or an e-axle. As shown in FIG. 8, the housing 6 is rigid-connected to at least one of the engine, the transmission, the motor, and the e-axle which are the vibration generation sources 13 in the vehicle 12. In FIG. 8, the housing 6 is a part shown by a broken line. In a case of using the power conversion device 1 configured as described above, it is possible to ensure vibration resistance of the power conversion device 1 even if the housing 6 of the power conversion device 1 is rigid-connected to the vibration generation source 13 included in the vehicle 12 subject to strict requirements in vibration resistance. Both in a configuration in which the power module 2 is formed by transfer molding and a configuration in which the power module 2 is sealed by a gel, it is possible to ensure vibration resistance of the power conversion device 1 in a state in which the housing 6 of the power conversion device 1 is rigid-connected to the vibration generation source 13 included in the vehicle 12 subject to strict requirements in vibration resistance.

As described above, the power conversion device 1 according to the first embodiment includes: a plurality of power modules 2 including the semiconductor chips 10 and arranged side by side, each power module 2 being formed in a rectangular parallelepiped shape having the first surface 2*a*, the second surface 2*b* opposite to the first surface 2*a*, and four surfaces surrounding the first surface 2*a* and the second surface 2*b*; the board 3 which is placed at the second surfaces 2*b* of the plurality of power modules 2 with a space provided between the board 3 and the second surfaces 2*b*, and is electrically connected to the module terminals 2*g* that the plurality of power modules 2 respectively have; and the board retention member 4 which is placed in the space between the board 3 and the plurality of power modules 2 and retains the board 3, the board retention member 4 being made of a resin member having insulation property. The plurality of power modules 2 are arranged side by side in the direction parallel to the third surfaces 2*c*. Each module terminal 2*g* protrudes from at least one of the second surface 2*b*, the third surface 2*c*, and the fourth surface 2*d* opposite to the third surface 2*c*, and then extends toward the board 3. A part of the module terminal 2*g* extending toward the board 3 penetrates the through hole 4*a* that the board retention member 4 has. Thus, the board 3 is retained by the board retention member 4 placed in the space between the board 3 and the plurality of power modules 2, whereby vibration resistance of the board 3 and components mounted to the board 3 can be ensured. Since the board 3 need not be retained by providing a gap between the power modules 2 arranged side by side, the size and the cost of the power conversion device 1 can be reduced. Since the module terminal 2*g* is connected to the board 3 by penetrating the through hole 4*a* that the board retention member 4 has, the module terminal 2*g* can be shortened, whereby the size and the cost of the power conversion device 1 can be reduced.

The placement surface 6*a* may have the boss fixed portion 6*b* to which the fixation boss 4*b* that the board retention member 4 has is fixed, and the boss fixed portion 6*b* may be provided at the part of the placement surface 6*a* other than the cooling surface 9*a* and a projected part of the placement surface 6*a* where the film capacitor 5 and the busbar 7 are projected on the placement surface 6*a*. Thus, since the board retention member 4 retaining the board 3 is fixed to the part of the placement surface 6*a* other than the cooling surface 9*a* and the projected part of the placement surface 6*a* where the film capacitor 5 and the busbar 7 are projected on the placement surface 6*a*, the boss fixed portions 6*b* need not be provided between the power modules 2 arranged side by side, at the cooling surface 9*a* where the flow path 9*b* is provided on the inner side, and between the power modules 2 and the film capacitor 5. Since the boss fixed portions 6*b* need not be provided between the power modules 2 arranged side by side, at the cooling surface 9*a*, and between the power modules 2 and the film capacitor 5, the size and the cost of the power conversion device 1 can be reduced. Since the board 3 is retained by the board retention member 4, vibration resistance of the board 3 and components mounted to the board 3 can be ensured.

The through holes 4*a* may have funnel shapes of which openings on the side of the plurality of power modules 2 are larger than openings on the side of the drive circuit board 3*b*. Thus, an additional guide component for guiding the module terminal 2*g* to the through hole 3*g* is not needed, so that the distance between the power module 2 and the drive circuit board 3*b* can be shortened. Since the distance between the power module 2 and the drive circuit board 3*b* is shortened, the distance between the power module 2 and the drive circuit can be shortened, whereby controllability for the power module 2 can be improved. In addition, since the height of the power conversion device 1 is reduced, the size of the power conversion device 1 can be reduced.

The board 3 may be retained at the board retention member 4 by the connection terminal 4*c*. Thus, the connection terminal 4*c* can be used as a structural member for fixing the board 3 to the board retention member 4, without using a fastening member such as a bolt. As compared to a bolt, in a case of fixing the board 3 by the connection terminal 4*c*, the board 3 can be fixed with a smaller area, whereby the size of the power conversion device 1 can be reduced. In addition, as compared to a bolt, in a case of fixing the board 3 by the connection terminal 4*c*, the board 3 can be fixed in a short time in manufacturing, so that the number of assembly steps in manufacturing and the investment amount for assembly equipment can be decreased and thus productivity of the power conversion device 1 can be improved.

The connection terminal 4*c* part may be an electric circuit wire. Thus, since the connection terminal 4*c* can be used as a wire for an electric circuit, wiring patterns on the board 3 are reduced, whereby the size of the power conversion device 1 can be reduced.

The power conversion device 1 may include a plurality of boards 3, the connection terminal 4*c* may be mechanically connected to the plurality of boards 3, and the connection terminal 4*c* part may be an electric circuit wire. Thus, without placing the boards above an electric component having a great height, the plurality of boards 3 can be placed in an area where electric components having small heights are present in the vicinity of the electric component having a great height. Since the plurality of boards 3 are placed in the vicinity of the electric component having a great height, a wasteful space in the vicinity of the electric component having a great height can be eliminated, whereby the size of the power conversion device 1 can be reduced. In addition, since board-connection connectors and harnesses for connecting the plurality of boards 3 are not needed, the size and the cost of the power conversion device 1 can be reduced.

As seen in the direction perpendicular to the second surfaces 2*b* of the plurality of power modules 2, the plurality of boards 3 may be arranged so as to overlap each other at least partially. Thus, as seen in the direction perpendicular to the second surfaces 2*b* of the plurality of power modules 2, the area occupied by the boards 3 in the power conversion device 1 can be reduced, whereby the size of the power conversion device 1 can be reduced.

The additional board retention member 11 may be provided at a part between the plurality of boards 3 overlapping each other, and the additional board retention member 11 may retain at least one of the boards 3. Thus, insulation property between the plurality of boards 3 overlapping each other can be improved. Since at least one of the boards 3 is retained by the additional board retention member 11 in addition to the connection terminal 4*c* of the board retention member 4, vibration resistance of the at least one board 3 and components mounted to the board 3 can be further improved.

The board retention member 4 may be provided in at least a part between the drive circuit board 3*b*, and the busbar 7 and the AC busbars 8*a*. Thus, the board retention member 4 having insulation property is provided between the drive circuit board 3*b*, and the busbar 7 part and the AC busbar 8*a* parts to have high voltages, whereby insulation between the drive circuit board 3*b*, and the busbar 7 part and the AC busbar 8*a* parts, can be ensured by the board retention member 4. Since insulation between the drive circuit board 3*b*, and the busbar 7 part and the AC busbar 8*a* parts, is ensured, the distances between the drive circuit board 3*b*, and the busbar 7 part and the AC busbar 8*a* parts, can be shortened. Since the distances between the drive circuit board 3*b*, and the busbar 7 part and the AC busbar 8*a* parts, can be shortened, the size of the power conversion device 1 can be reduced.

The board retention member and the mounted component part opposed to the board retention member may be adhered via an adhesive 3*f*. Thus, the mounted component is fixed to the board retention member, whereby vibration resistance of the board 3 and the mounted component mounted to the board 3 can be further ensured. Since vibration resistance of the board 3 and the mounted component mounted to the board 3 is further ensured, the power conversion device 1 according to the present disclosure can be used as a power conversion device rigid-connected to an automobile motor, which is subject to strict requirements in vibration resistance.

The fixation boss 4*b* of the board retention member 4 and the housing 6 may be made of metal, and the plate 4*d*, the fixation boss 4*b*, and the ground of the board 3 may be electrically connected. Thus, the plate 4*d*, the fixation boss 4*b*, and the ground of the board 3 have the same potential as the ground which is the potential of the housing 6, so that it is possible to easily provide a necessary ground pattern for the transformer 3*c* connected to the drive circuit of the board 3. In addition, since the plate 4*d* is provided between the semiconductor chip 10 of the power module 2 and the board 3 and is connected to the ground, the plate 4*d* can serve as a noise shield for blocking noise generated in switching of the semiconductor chip 10. Since the plate 4*d* serves as a noise shield, it is not necessary to newly add a noise shield and thus productivity of the power conversion device 1 can be improved. In addition, since the plate 4*d* has a higher Young's modulus than a resin material of the board retention member 4, rigidity of the board retention member 4 can be improved. In addition, since rigidity of the board retention member 4 is improved, vibration resistance of the board 3 fixed to the board retention member 4 and electric components mounted to the board 3 can be improved.

The housing 6 may be rigid-connected to at least one of an engine, a transmission, a motor, and an e-axle which are the vibration generation sources 13 in the vehicle 12. Thus, it is possible to ensure vibration resistance of the power conversion device 1 even if the housing 6 of the power conversion device 1 is rigid-connected to the vibration generation source 13 included in the vehicle 12 subject to strict requirements in vibration resistance.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

Additional Note 1

A power conversion device comprising:

a plurality of power modules including semiconductor chips and arranged side by side, each power module being formed in a rectangular parallelepiped shape having a first surface, a second surface opposite to the first surface, and a third surface, a fourth surface, a fifth surface, and a sixth surface which are four surfaces surrounding the first surface and the second surface;

a board which is placed at the second surfaces of the plurality of power modules with a space provided between the board and the second surfaces, and is electrically connected to module terminals that the plurality of power modules respectively have; and a board retention member which is placed in the space between the board and the plurality of power modules and retains the board, the board retention member being made of a resin member having insulation property, wherein the plurality of power modules are arranged side by side in a direction parallel to the third surfaces, each module terminal protrudes from at least one of the second surface of the power module, the third surface of the power module, and the fourth surface opposite to the third surface, and then extends toward the board, and a part of the module terminal extending toward the board penetrates a through hole that the board retention member has.

Additional Note 2

The power conversion device according to additional note 1, comprising:

a cooler having a cooling surface to which the first surfaces of the plurality of power modules are thermally connected;

a housing having the cooler and having a placement surface on the same side as a side where the cooling surface is provided; and a film capacitor electrically connected to the plurality of power modules via a busbar, the film capacitor being adjacent to the plurality of power modules and thermally connected to the placement surface of the housing, wherein the placement surface has a boss fixed portion to which a fixation boss that the board retention member has is fixed, and the boss fixed portion is provided at a part of the placement surface other than the cooling surface and a projected part of the placement surface where the film capacitor and the busbar are projected on the placement surface.

Additional Note 3

The power conversion device according to additional note 1 or 2, wherein the through holes have funnel shapes of which openings on a side of the plurality of power modules are larger than openings on a side of the board.

Additional Note 4

The power conversion device according to any one of additional notes 1 to 3, wherein the board retention member has a connection terminal mechanically connected to the board, the connection terminal has a buried portion buried in the board retention member and an extending portion extending toward the board and connected to the board, and the board is retained at the board retention member by the connection terminal.

Additional Note 5

The power conversion device according to additional note 4, wherein the connection terminal part is an electric circuit wire.

Additional Note 6

The power conversion device according to additional note 4, comprising a plurality of the boards, wherein the connection terminal is mechanically connected to the plurality of boards, and the connection terminal part is an electric circuit wire.

Additional Note 7

The power conversion device according to additional note 6, wherein as seen in a direction perpendicular to the second surfaces of the plurality of power modules, the plurality of boards are arranged so as to overlap each other at least partially.

Additional Note 8

The power conversion device according to additional note 7, wherein an additional board retention member is provided at a part between the plurality of boards overlapping each other, and the additional board retention member retains at least one of the boards.

Additional Note 9

The power conversion device according to any one of additional notes 2 to 8, comprising an AC terminal having AC busbars and electrically connected to the plurality of power modules via the AC busbars, wherein the board retention member is provided in at least a part between the board, and the busbar and the AC busbars.

Additional Note 10

The power conversion device according to any one of additional notes 1 to 9, wherein at least one of a transformer, an aluminum electrolytic capacitor, and a backup transformer which are mounted components and are electrically connected to the power modules, is provided to the board, and the board retention member and the mounted component part opposed to the board retention member are adhered via an adhesive.

Additional Note 11

The power conversion device according to any one of additional notes 2 to 10, wherein
the board retention member has, therein, a plate made of metal,
the fixation boss of the board retention member and the housing are made of metal, and
the plate, the fixation boss, and a ground of the board are electrically connected.

Additional Note 12

The power conversion device according to any one of additional notes 2, 9, and 11, wherein
the housing is rigid-connected to at least one of an engine, a transmission, a motor, and an e-axle which are vibration generation sources in a vehicle.

DESCRIPTION OF THE REFERENCE CHARACTERS 1 power conversion device
2 power module
2a first surface
2b second surface
2c third surface
2d fourth surface
2e fifth surface
2f sixth surface
2g module terminal
2h power terminal
3 board
3a control circuit board
3b drive circuit board
3c transformer
3d aluminum electrolytic capacitor
3e backup transformer
3f adhesive
3g through hole
3h fixation portion
31 fixation assist portion
4 board retention member
4a through hole
4b fixation boss
4c connection terminal
4c1 buried portion
4c2 extending portion
4d plate
4e board fixed portion
4f connection wire
5 film capacitor
6 housing
6a placement surface
6b boss fixed portion
7 busbar
8 AC terminal
8a AC busbar
9 cooler
9a cooling surface
9b flow path
9c lid
10 semiconductor chip 11 additional board retention member
11a board fixed portion
11b recess
11c fixation boss
12 vehicle
13 vibration generation source

What is claimed is:
1. A power conversion device comprising:
a plurality of power modules including semiconductor chips and arranged side by side, each power module being formed in a rectangular parallelepiped shape having a first surface, a second surface opposite to the first surface, and a third surface, a fourth surface, a fifth surface, and a sixth surface which are four surfaces surrounding the first surface and the second surface;
a board which is placed at the second surfaces of the plurality of power modules with a space provided between the board and the second surfaces, and is electrically connected to module terminals that the plurality of power modules respectively have;
a board retention member which is placed in the space between the board and the plurality of power modules and retains the board, the board retention member being made of a resin member having insulation property;
a cooler having a cooling surface to which the first surfaces of the plurality of power modules are thermally connected;
a housing having the cooler and having a placement surface on the same side as a side where the cooling surface is provided; and
a film capacitor electrically connected to the plurality of power modules via a busbar, the film capacitor being adjacent to the plurality of power modules and thermally connected to the placement surface of the housing, wherein
the plurality of power modules are arranged side by side in a direction parallel to the third surfaces,
each module terminal protrudes from at least one of the second surface of the power module, the third surface of the power module, and the fourth surface opposite to the third surface, and then extends toward the board,
a part of the module terminal extending toward the board penetrates a through hole that the board retention member has,
the placement surface has a boss fixed portion to which a fixation boss that the board retention member has is fixed, and
the boss fixed portion is provided at a part of the placement surface other than the cooling surface and a projected part of the placement surface where the film capacitor and the busbar are projected on the placement surface.
2. The power conversion device according to claim 1, wherein
the through holes have funnel shapes of which openings on a side of the plurality of power modules are larger than openings on a side of the board.
3. The power conversion device according to claim 1, wherein
the board retention member has a connection terminal mechanically connected to the board,
the connection terminal has a buried portion buried in the board retention member and an extending portion extending toward the board and connected to the board, and the board is retained at the board retention member by the connection terminal.

4. The power conversion device according to claim 3, wherein the connection terminal is an electric circuit wire.

5. The power conversion device according to claim 3, further comprising a plurality of boards, wherein the connection terminal is mechanically connected to the plurality of boards, and the connection terminal part is an electric circuit wire.

6. The power conversion device according to claim 5, wherein as seen in a direction perpendicular to the second surfaces of the plurality of power modules, the plurality of boards are arranged so as to overlap each other at least partially.

7. The power conversion device according to claim 6, wherein an additional board retention member is provided at a part between the plurality of boards overlapping each other, and the additional board retention member retains at least one of the boards.

8. The power conversion device according to claim 1, comprising an AC terminal having AC busbars and electrically connected to the plurality of power modules via the AC busbars, wherein the board retention member is provided in at least a part between the board, and the busbar and the AC busbars.

9. The power conversion device according to claim 1, wherein at least one of a transformer, an aluminum electrolytic capacitor, and a backup transformer which are mounted components and are electrically connected to the power modules, is provided to the board, and the board retention member and the mounted component opposed to the board retention member are adhered via an adhesive.

10. The power conversion device according to claim 1, wherein the board retention member has, therein, a plate made of metal, the fixation boss of the board retention member and the housing are made of metal, and the plate, the fixation boss, and a ground of the board are electrically connected.

11. The power conversion device according to claim 1, wherein the housing is rigid-connected to at least one of an engine, a transmission, a motor, and an e-axle which are vibration generation sources in a vehicle.

* * * * *